United States Patent
Ocola et al.

(10) Patent No.: US 11,915,926 B2
(45) Date of Patent: Feb. 27, 2024

(54) PERCOLATION DOPING OF INORGANIC-ORGANIC FRAMEWORKS FOR MULTIPLE DEVICE APPLICATIONS

(71) Applicant: International Business Machines Corporation, Armonk, NY (US)

(72) Inventors: Leonidas Ernesto Ocola, Wappingers Falls, NY (US); Eric A. Joseph, Croton on Hudson, NY (US); Hiroyuki Miyazoe, White Plains, NY (US); Takashi Ando, Eastchester, NY (US); Damon Brooks Farmer, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 98 days.

(21) Appl. No.: 17/485,659

(22) Filed: Sep. 27, 2021

(65) Prior Publication Data
US 2023/0097847 A1    Mar. 30, 2023

(51) Int. Cl.
| | | |
|---|---|---|
| H01L 21/02 | (2006.01) | |
| H01L 29/40 | (2006.01) | |
| C23C 16/02 | (2006.01) | |
| C23C 16/04 | (2006.01) | |
| C23C 16/40 | (2006.01) | |
| C23C 16/455 | (2006.01) | |

(52) U.S. Cl.
CPC .... *H01L 21/02203* (2013.01); *C23C 16/0245* (2013.01); *C23C 16/045* (2013.01); *C23C 16/403* (2013.01); *C23C 16/45525* (2013.01); *H01L 21/02178* (2013.01); *H01L 21/02181* (2013.01); *H01L 29/408* (2013.01)

(58) Field of Classification Search
None
See application file for complete search history.

(56) References Cited

U.S. PATENT DOCUMENTS

| | | | |
|---|---|---|---|
| 7,135,207 | B2 | 11/2006 | Min et al. |
| 7,410,918 | B2 | 8/2008 | Vaartstra |
| 7,846,807 | B2 | 12/2010 | Tang et al. |
| 8,871,670 | B2 | 10/2014 | Seebauer |
| 9,029,985 | B2 | 5/2015 | Driscoll et al. |
| 9,153,624 | B2 | 10/2015 | Jo |

(Continued)

FOREIGN PATENT DOCUMENTS

| | | |
|---|---|---|
| CN | 106876400 B | 6/2017 |
| KR | 101003214 B1 | 12/2010 |

OTHER PUBLICATIONS

Chakrabarti et al., "Nanoporous Dielectric Resistive Memories Using Sequential Infiltration Synthesis" ACS nano 15.3 (Mar. 2021) pp. 4155-4164.

(Continued)

*Primary Examiner* — Shamim Ahmed
*Assistant Examiner* — Bradford M Gates
(74) *Attorney, Agent, or Firm* — CANTOR COLBURN LLP; L. Jeffrey Kelly

(57) ABSTRACT

A porous thin film includes a framework that includes a plurality of pores. The pores extend from an opening located at an upper surface of the framework to a bottom surface contained in the framework. A pore-coating film is formed on sidewalls and the bottom surface of the pores.

14 Claims, 10 Drawing Sheets

(56) References Cited

U.S. PATENT DOCUMENTS

| | | | |
|---|---|---|---|
| 9,231,209 B2 | 1/2016 | Mares et al. | |
| 9,231,239 B2 | 1/2016 | Yang | |
| 9,583,700 B2 | 2/2017 | Lee et al. | |
| 9,583,701 B1 | 2/2017 | Gee et al. | |
| 10,483,464 B1 | 11/2019 | Chakrabarti et al. | |
| 2008/0124919 A1* | 5/2008 | Huang | H01L 21/02063 438/643 |
| 2010/0308383 A1* | 12/2010 | Shin | H01L 29/4983 257/632 |
| 2014/0014892 A1 | 1/2014 | Chiang et al. | |
| 2015/0179935 A1 | 6/2015 | Hong et al. | |
| 2015/0349251 A1 | 12/2015 | Chang et al. | |
| 2017/0037509 A1* | 2/2017 | Faguet | B05D 7/22 |
| 2017/0098810 A1* | 4/2017 | Whear | H01M 50/437 |
| 2017/0373173 A1* | 12/2017 | Ohta | H10N 70/8836 |
| 2018/0047898 A1 | 2/2018 | Ridgeway et al. | |

OTHER PUBLICATIONS

George et al., "Metalcones: Hybrid Organic-Inorganic Films Fabricated Using Atomic and Molecular Layer Deposition Techniques" Journal of nanoscience and nanotechnology, vol. 11 (Sep. 2011) (8 pages).

Jeon et al., "Atomic Layer Deposition of Al2 O 3 Thin Films Using Trimethylaluminum and Isopropyl Alcohol" Abstract—Journal of the Electrochemical Society 149.6 (Apr. 2002) (1 page ).

Selvaraj et al., "Effect of Using Ethanol as the Oxygen Source on the Growth and Dielectric Behavior of Atomic Layer Deposited Hafnium Oxide" Abstract—ECS Transactions 61.6 (Mar. 2014) (3 pages).

Seo et al., "Atomic Layer Deposition of Al2O3 with Alcohol Oxidants for Impeding Substrate Oxidation" ECS Meeting Abstracts. No. 24. IOP Publishing, (Sep. 2019) (4 pages).

* cited by examiner

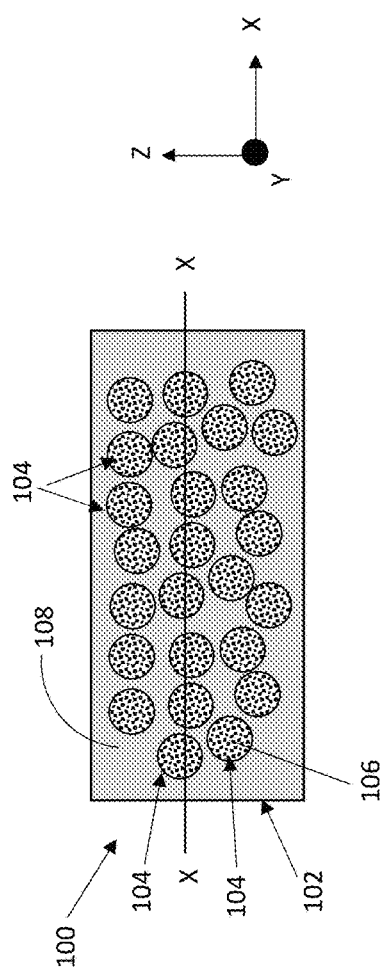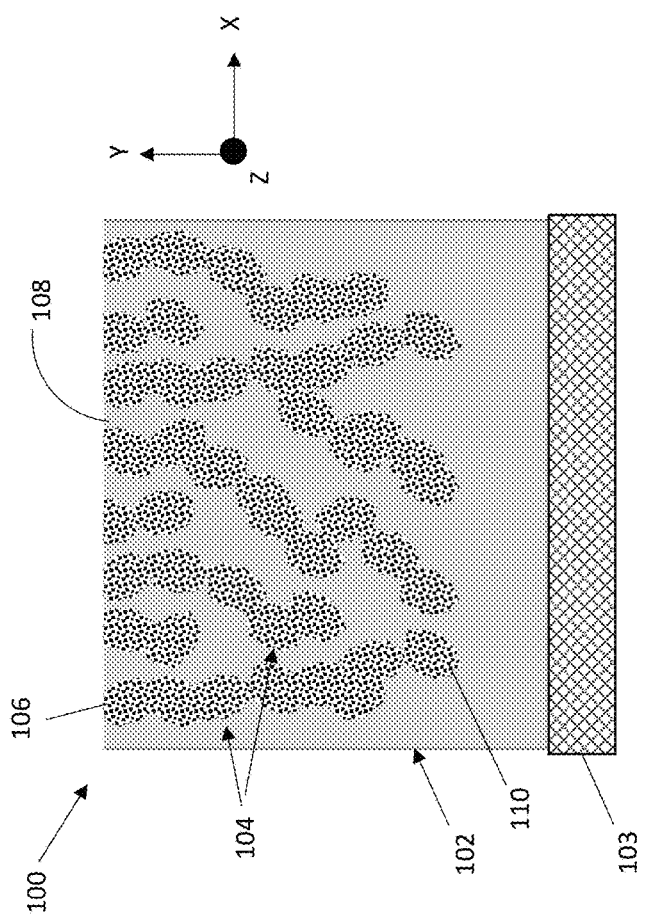

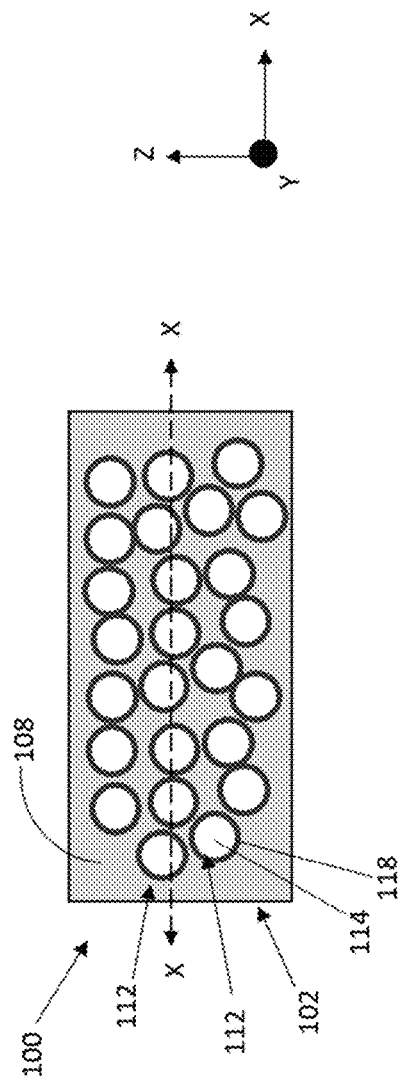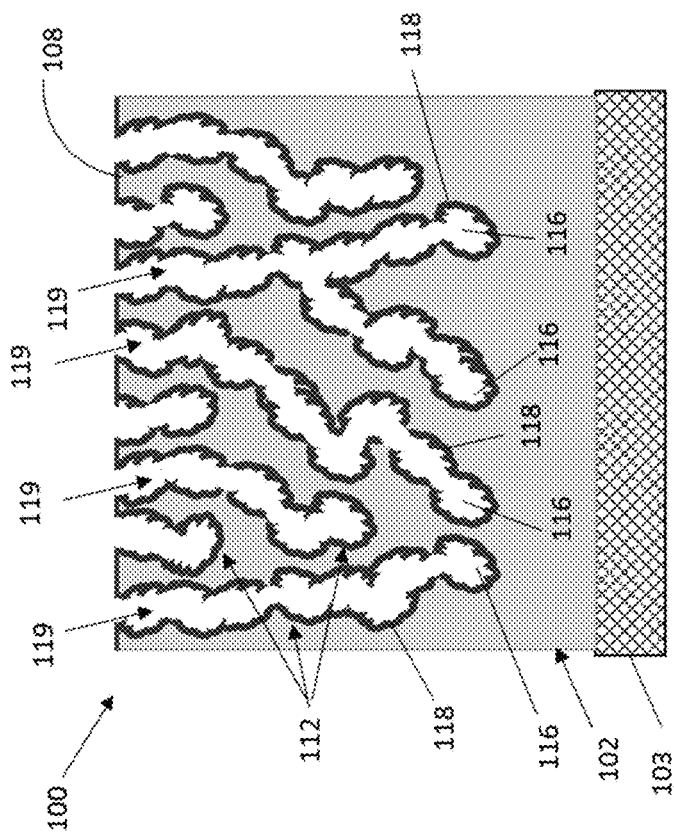

PERCOLATION DOPING OF INORGANIC-ORGANIC FRAMEWORKS FOR MULTIPLE DEVICE APPLICATIONS

BACKGROUND

The present invention relates in general to fabrication methods and resulting porous thin film materials for multiple types of devices. More specifically, the present invention relates to percolation doping (also referred to as "infiltration") of inorganic-organic frameworks to be used as part of an electronic device or as a standalone film.

The ever changing need for better devices as part of the advancement of our society motivates the invention of novel materials. Porous metal oxide films that are useful in electronic devices with pores that are scalable along with CMOS semiconductors is a subject of intense research.

SUMMARY

Embodiments of the present invention are directed to a method to synthesize a porous thin film. The method includes performing an oxidation process to remove carbon impurities from a framework such that pores are formed in the framework. Each of the pores extend from an upper surface of the framework to a bottom surface contained in the framework.

Embodiments of the present invention are directed to a method of synthesizing a porous thin film. The method comprises forming a non-organic framework including a plurality of organic impurities. The organic impurities extend from a first end located at an upper surface of the framework to a second end contained in the framework. The method further comprises removing the organic impurities to form pores extending from the upper surface of the framework to a bottom surface contained in the framework. The method further comprises coating sidewalls and the bottom surface of the pores with a pore-coating film.

Embodiments of the present invention are directed to a porous thin film. The porous thin film includes a framework that includes a plurality of pores. The pores extend from an opening located at an upper surface of the framework to a bottom surface contained in the framework. A pore-coating film is formed on sidewalls and the bottom surface of the pores.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings.

FIGS. 1A-3B depict multiple cross-sectional views following various fabrication operations for synthesizing a thin film, in which:

FIG. 1A depicts a top view of a porous thin film after performing various intermediate fabrication operations in accordance with aspects of the present invention;

FIG. 1B depicts a cross-sectional view of the porous thin film shown in FIG. 1A;

FIG. 3A depicts a top view of the porous thin film after performing additional fabrication operations in accordance with aspects of the present invention;

FIG. 3B depicts a cross-sectional view of the porous thin film shown in FIG. 3A.

DETAILED DESCRIPTION

Figure 2A:
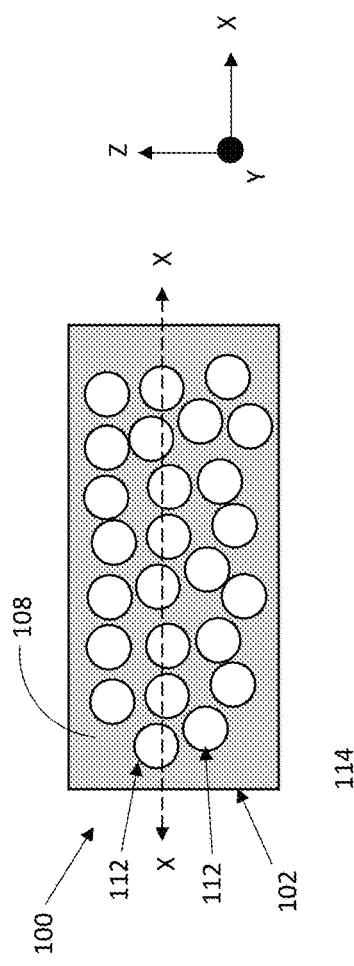
FIG. 2A depicts a top view of the porous thin film after performing additional fabrication operations in accordance with aspects of the present invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

State of the art percolation doping techniques (also referred to as "infiltration") has been confined for the most part to polymer materials because making porous metal oxide films useful for electronic devices is very difficult. One or more non-limiting embodiments of the present invention provides a method of creating porous thin films in a manner that can be integrated to the semiconductor manufacturing industry. The applications where the films described here can be utilized include, but are not limited to, metal-insulator-metal devices such as capacitors and resistive memory, sensors, electrochemical cells, transistors, and nanofilters.

In some embodiments of the present invention, the method utilizes a carbon-rich metal oxide film material that includes a plurality of carbon impurities which can be removed by a remote plasma etch to form a plurality of pores. The pores provide a permeable media upon which the pore walls can be exposed to an infiltration or doping process to deposit a pore-coating film. The infiltration or percolation doping process can be performed at low temperatures, which provide low reactivity of metal oxide precursor and oxidizer to synthesize a carbon-rich film.

The method of synthesizing a porous thin film as described herein also allows for improving the precision of the thin film material porosity by controlling fabrication parameters such as, for example, temperature, oxidant used (e.g., water or alcohols of different molecular weight), and ratio of metal precursor pulses to oxidant pulses in an ALD tool. In one or more non-limiting embodiments of the present invention, the method allows for synthesizing a porous thin film with tunable properties such as bandgap, electron conduction, ion conduction, and oxygen vacancy mobility, with nanoscale control.

With reference now to FIGS. 1A and 1B, a porous thin film 100 is illustrated after performing various intermediate fabrication operations in accordance with aspects of the present invention. Although the diagrams depicted are two-dimensional, it is understood that the diagrams depicted herein represent three-structures. FIG. 1A is a top-down diagram of the porous thin film 100 having a framework 102 extending along a first axis (e.g., an X-axis) to define a film length and a second axis (e.g., Z-axis) orthogonal to the first axis to define a film width. FIG. 1B is a cross-sectional view taken along line X-X to illustrate the framework 102 extending along the first axis (e.g., the X-axis) and a third axis (e.g., Y-axis) orthogonal to both the first axis and the second axis to define a film height. It should be appreciated that the orientations of the porous thin film 100 and descriptions of X, Y and Z axes described above can also be applied to FIGS. 2A-2B and 3A and 3B, which are described in greater detail below.

The framework 102 is deposited on a substrate 103 (e.g., a silicon substrate) and is formed from a metal oxide film material that includes a plurality of carbon impurities 104. The metal oxide material can be referred to as a non-organic material, while the carbon impurities can be referred to as an organic material. Accordingly, the framework can be referred to as a "non-organic-organic film" or a "carbon-rich metal oxide film". The carbon impurities 104 extend along the Y-axis from a first end 106 located at an upper surface 108 of the framework 102 to an opposing second end 110 that is embedded within the framework 102.

In one or more embodiments of the present invention, the framework 102 is formed by performing an atomic layer deposition (ALD) process to deposit a metal oxide material on the substrate 103. The metal oxide material includes, but is not limited to, hafnium oxide ($HfO_2$), aluminum oxide ($Al_2O_3$) zirconium oxide (ZrO), and titanium oxide ($TiO_2$). In some embodiments of the present invention, a spin-coating process is performed to deposit a polymer material that forms the framework 102. The polymer material can include, but is not limited to, polymethylmethacrylate, SU8 resist, polyvinyl alcohol, and polydimethylsiloxane.

The ALD process uses an oxidizer and is performed at a low temperature ranging, for example, from about 50 degrees Celsius (50° C.) to about 250° C. The temperature used depends on the precursor chemistry used in the ALD tool to synthesize the film. The low temperature allows for low reactivity of the oxidizer, which results in the framework 102 containing the carbon impurities 104 shown in FIG. 1. The oxidizer includes, but is not limited to, water or alcohol. In some embodiments of the present invention, an ethanol-based precursor is used as the oxidizer for the purpose of increasing carbon content, and therefore film porosity. The longer the alcohol chain, the more porous the film as the distance between reactions increases and more carbon is left behind. In some embodiments of the present invention, the number of pulses of metal organic precursor is increased in comparison to pulses of oxidizer in the ALD tool to increase carbon content in the framework 102.

Figure 2B:
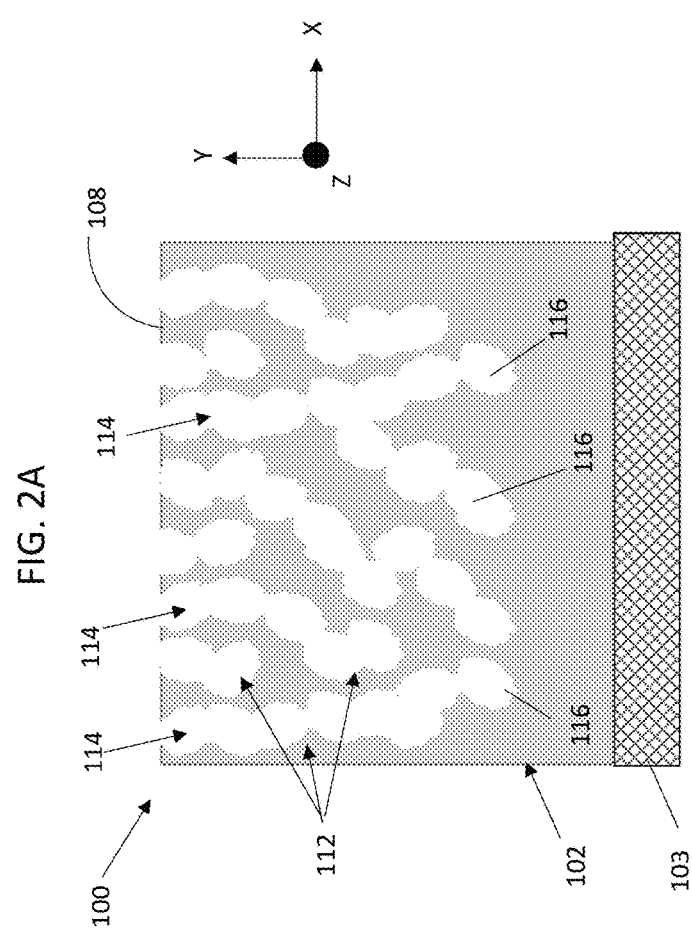
FIG. 2B depicts a cross-sectional view of the porous thin film shown in FIG. 2A.

Turning now to FIGS. 2A and 2B, the porous thin film 100 is illustrated following removal of the carbon impurities 104 from the framework 102. According to one or more non-limiting embodiments of the present invention, a plasma-based process such as a remote plasma etch, for example, is performed to remove the carbon impurities 104 without damaging the framework 102. The etchant chemistry can include, but is not limited to, a gas etchant, a UV ozone etchant, a liquid etchant, or a combination thereof. In some embodiments of the present invention, the plasma-based process employs nitrogen-oxygen (N2:O2)-based gas etchant that is applied at a temperature of about 100° C. for a time period ranging, for example about 10 seconds (s) to about 600 s, or more depending on film thickness and diffusion of oxidant into the film.

The removal of the carbon impurities 104 results in the formation of pores 112 in the framework 102. The pores 112 extend along the Y-axis from an opening 114 located at the upper surface 108 of the framework 102 to one or more opposing bottom surfaces 116 contained within the framework 102. The pores 112 provide a permeable media upon which the pore walls can be exposed to a coating or doping process as described herein.

Referring now to FIGS. 3A and 3B, the porous thin film 100 is illustrated after coating the pores 112 with a pore-coating film 118. The pore-coating film 118 can be deposited according to an atomic layer deposition (ALD) process, and can have a thickness ranging, for example, from about 0.1 nm to about 5 nm or more, depending on the pore size. In some embodiments of the present invention, the ALD process includes a high aspect ratio (HAR) ALD process, sometimes referred to as "infiltration" or "percolation doping", which is performed at low temperatures of less than 350° C., for example, for a limited number of cycles (e.g., 2 to 3 cycles). The low temperature range and limited cycles ensure that the percolation limit within the pores 112 is not exceeded so that the deposited pore-coating film 118 does not completely clog the pores 112. The temperature used depends on the reactivity of the pore coating ALD process used. Accordingly, the inner surfaces of the pores 112 (e.g., the sidewalls and bottom surface 116) can be coated with the pore-coating film 118 without completely filling the bottom surface 116. The pore-coating film 118 defines a void 119 which is smaller than the previously defined bottom surface 116, and extends from the upper surface of the framework 102 to the bottom surface 116. Thus, the thickness of the pore-coating film 188 defines the inner space of the remaining inner area of the pores 112. In some embodiments of the present invention, the void 119 can be filled with air. In some embodiments of the present invention, an optional hard organic free metal oxide thin film (not shown) is deposited prior to depositing the pore-coating film 118 to provide a interface of which a bottom electrode can be formed thereto. In an alternative embodiment, The coating of the pores with the porous thin film 100 is omitted entirely.

In one or more non-limiting embodiments of the present invention, the pore-coating film 118 is formed from a metal oxide material including, but not limited to, aluminum oxide ($Al_2O_3$), cerium oxide ($CeO_2$), tungsten trioxide ($WO_3$), and hafnium oxide ($HfO_2$). In some embodiments of the present invention, the pore-coating film 118 is formed from a metal material. In some embodiments of the present invention where the framework 102 is formed from a polymer material, the pore-coating film 118 can include, but is not limited to, aluminum oxide ($Al_2O_3$), zinc oxide (ZnO), hafnium oxide ($HfO_2$), tin oxide (SnO), and titanium oxide ($TiO_2$).

In some embodiments of the present invention, one or more refinement processes can be performed after forming the pore-coating film 118. For example, the framework 102 can be subsequently annealed at a high temperature of about 350° C., for example. In some embodiments of the present invention, refinement process includes performing a subsequent plasma process to remove any remaining ambient carbon contaminates from the framework.

Figure 4:
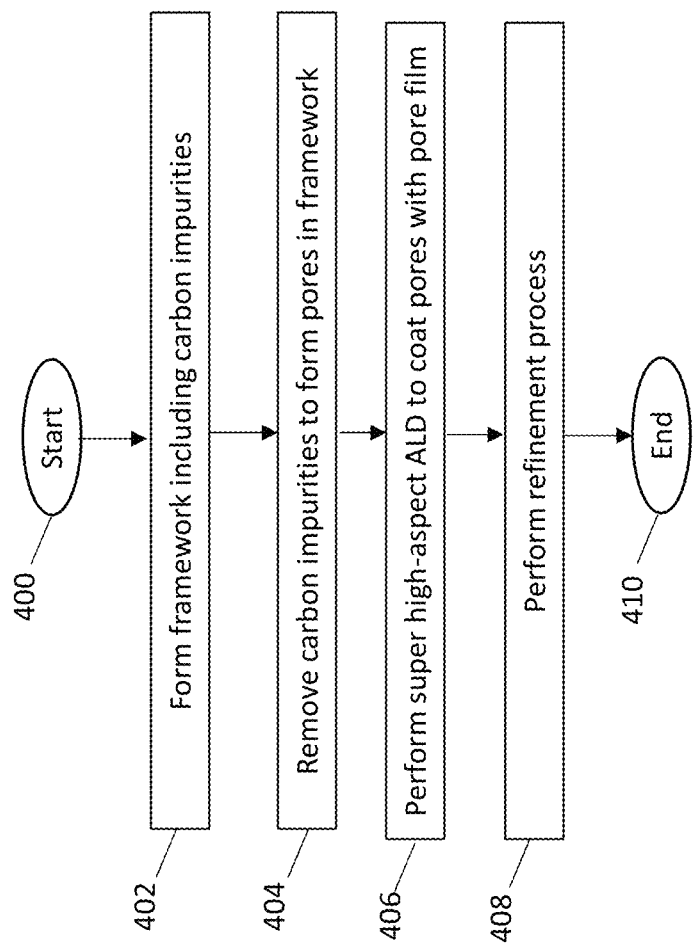
FIG. 4 is a flow diagram illustrating a method to synthesize a porous thin film according to embodiments of the present invention.

Turning now to FIG. 4, a method for synthesizing a porous thin film is illustrated according to embodiments of the present invention. The method begins at operation 400, and at operation 402 a framework including a non-organic material that contains a plurality of organic impurities is formed on a substrate. In some embodiments of the present invention, the non-organic material includes a metal oxide material, while the organic impurities include a carbon material. At operation 404, the carbon impurities are removed to form pores in the framework. In some embodiments of the present invention, a plasma-based process such as a remote plasma etch, for example, is performed to remove the carbon impurities 104 without damaging the framework 102. In some embodiments of the present invention, the plasma-based process employs nitrogen-oxygen (N2:O2)-based gas etchant that is applied at a temperature of about 100° C. for a time period ranging, for example about 10 seconds to about 6000 seconds or more depending on film thickness and diffusion of oxidant into film.

Turning to operation 406, a high-aspect ratio ALD process such as an "infiltration" process or "percolation doping" process is performed to coat the pores with a pore-coating film 118. In some embodiments of the present invention, the pore-coating film includes a metal oxide material including, but not limited to, $Al_2O_3$, $CeO_2$, $WO_3$, and $HfO_2$. The high-aspect ratio ALD process is performed at low temperatures of less than 350° C., for example, for a limited number of cycles (e.g., 2 to 3 cycles). The low temperature range and limited cycles ensure that the percolation limit within the pores 112 is not exceeded so that the deposited pore-coating film does not completely clog the pores 112. At operation 408, a refinement process is performed. The refinement process includes performing a plasma process to remove any remaining ambient carbon contaminates from the framework. Following completion of the refinement process, the method ends at operation 410.

Figure 5A:
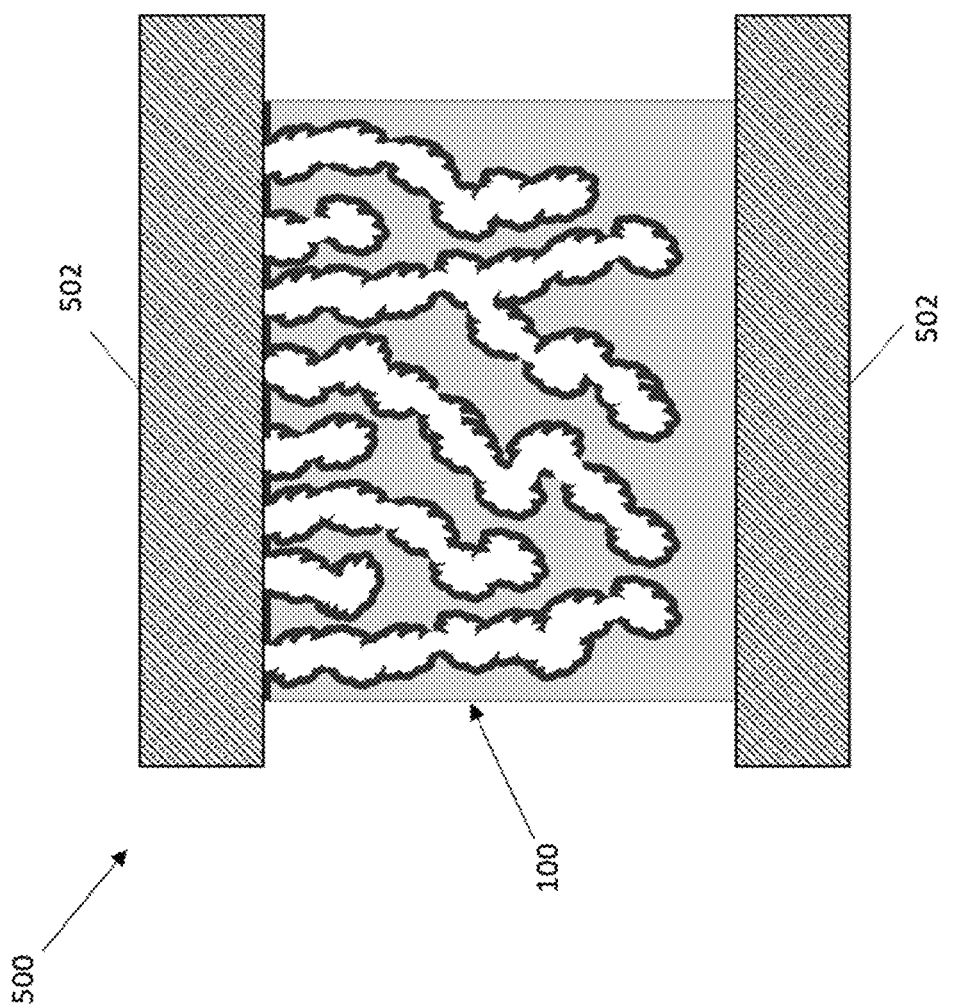
FIG. 5A illustrates an example of a porous thin film utilized in a metal-insulator-metal (MIM)

The porous thin film according to non-limiting embodiments of the present invention can be utilized various different applications. Turning to FIG. 5A, for example, a non-limiting embodiment of the present provides a porous thin film 100 that is utilized as the filament dielectric of a metal-insulator-metal (MIM) device 500. The MIM device 500 includes, but is not limited to, a resistive memory device such as resistive random access memory (RRAM).

As shown in FIG. 5A, the porous thin film 100 can be interposed between two opposing conducting electrodes 502. According to a non-limiting embodiment, the porous thin film 100 employs porous $HfO_2$ as the filament dielectric. In this example, the porous thin film 100 can be doped with other metal oxides including, but not limited to, $Al_2O_3$, $WO_3$, $CeO_2$, $TiO_2$, ZnO, SnO. In other non-limiting embodiments, the porous thin film 100 is undoped.

Figure 5B:
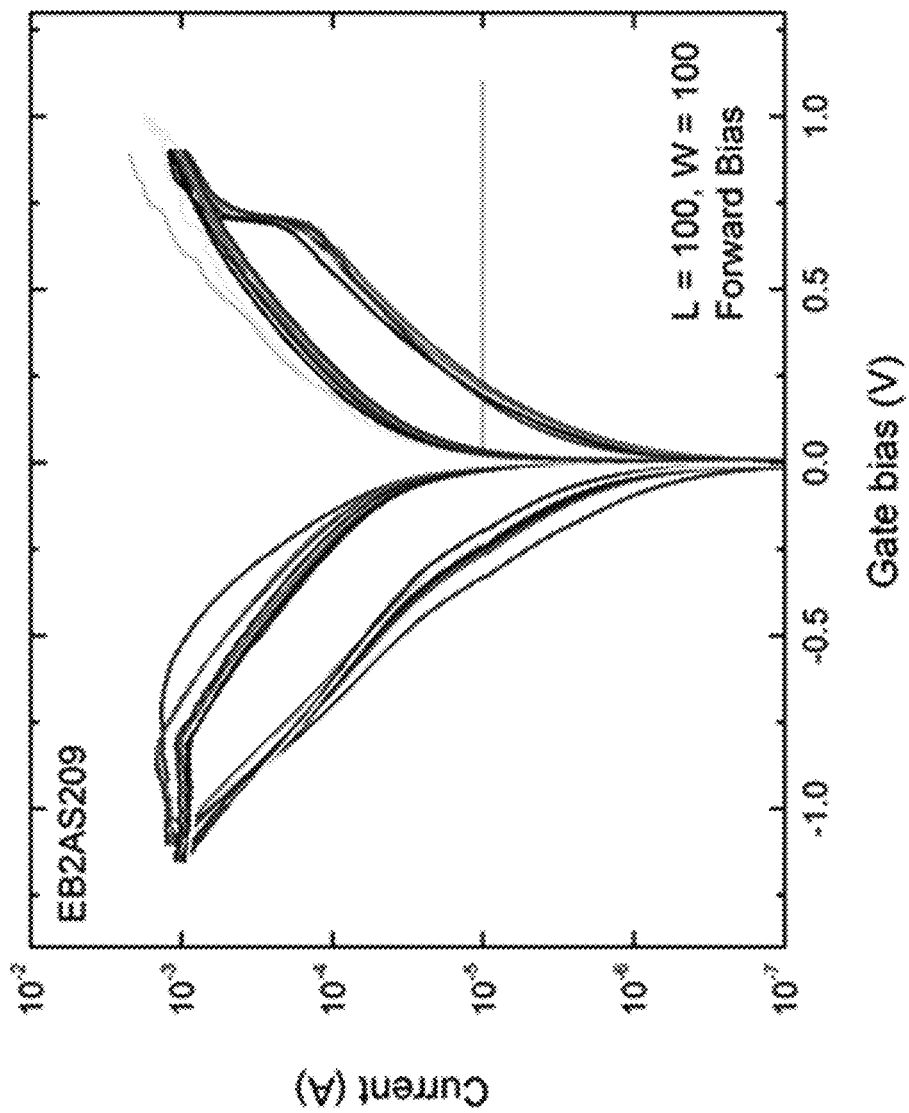
FIG. 5B depicts a graph illustrating current versus gate biased characteristics of the device illustrated demonstrating resistive memory (RRAM) application in FIG. 5A.

As shown in FIG. 5B, the MIM device 500 employing a porous thin film 100 as described herein provides electrical characteristics of resistive memory. For example, a MIM device 500 employing a porous thin film 100 of $HfO_2$ has low forming voltage and bistable resistive states needed for RRAM switching. In addition, the resulting porous thin film 100 has surface states at pores requiring less energy to remove defects, which is advantageous for both resistive memory devices.

Figure 6:
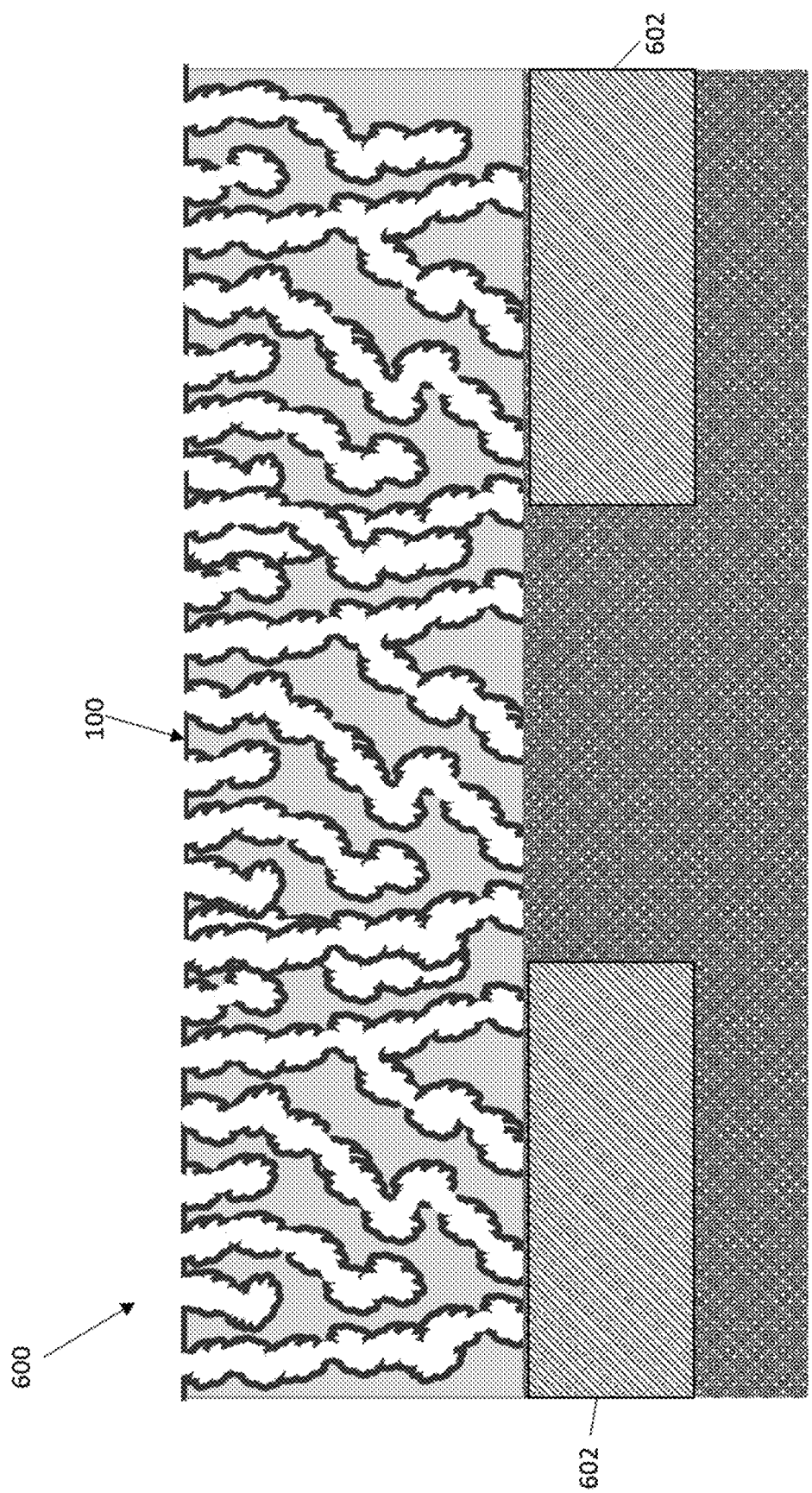
FIG. 6 illustrates an example of a porous thin film utilized in a sensor device according to a non-limiting embodiment of the present invention.

Turning to FIG. 6, an example of a porous thin film 100 utilized in a sensor device 600 according to a non-limiting embodiment of the present invention. The sensor device 600 can include, but is not limited to, a gas sensor, a liquid sensor, and/or a light sensor. According to the non-limiting embodiment shown in FIG. 6, the sensor device 600 includes two electrodes 602 to apply current. Although the two electrodes 602 are shown located at the bottom of the porous thin film 100, it should be appreciated that the electrodes 602 can be disposed at different locations, e.g., at the top of the porous thin film 100. The sensor device 600 can be tailored to be analyte specific by proper functionalization, and the applied current can be affected by the interaction of the pore network with any gas, liquid, or light in the environment.

Figure 7:
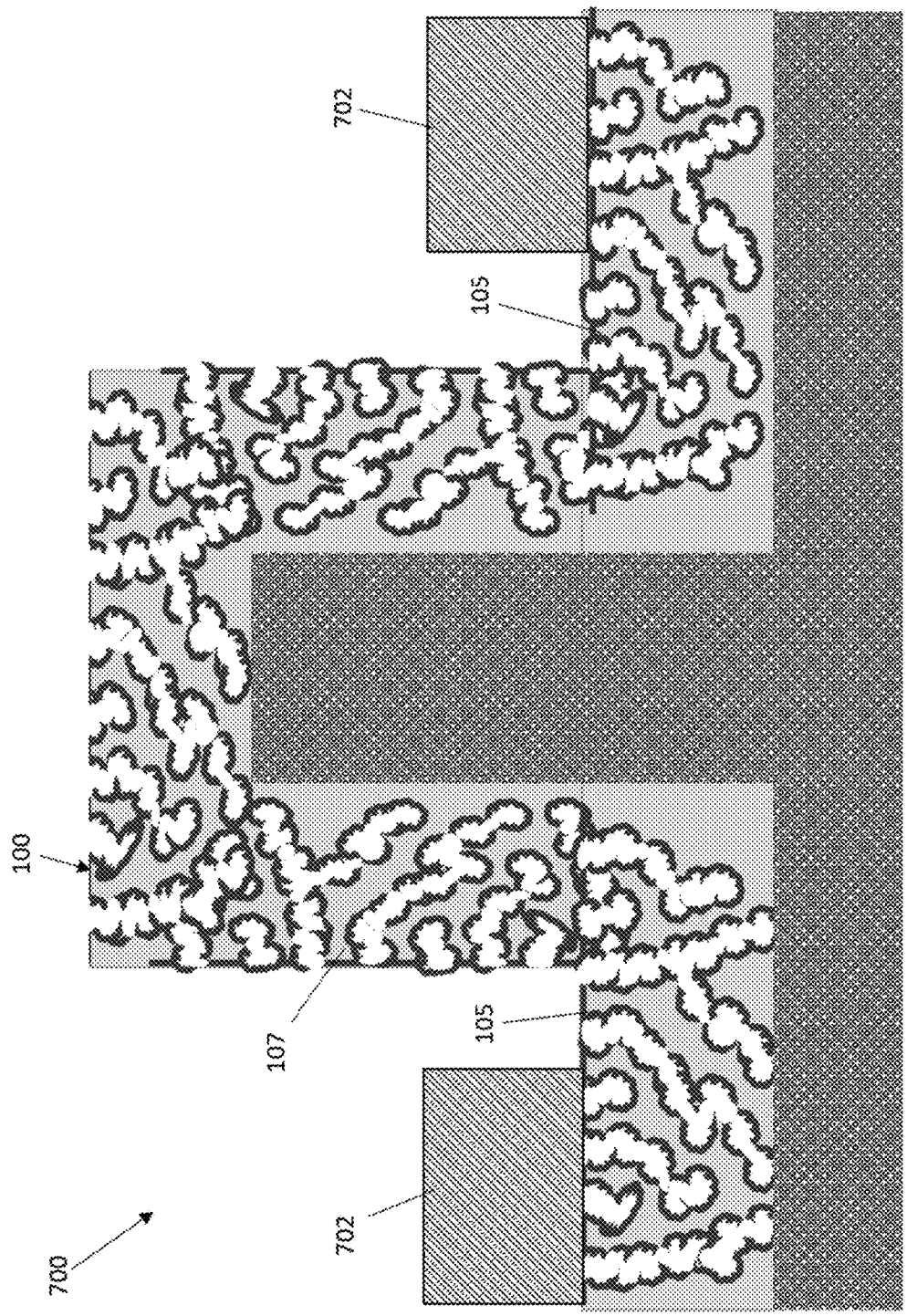
FIG. 7 illustrates an example of a porous thin film utilized in a vertical sensor device according to a non-limiting embodiment of the present invention.
Figure 8:
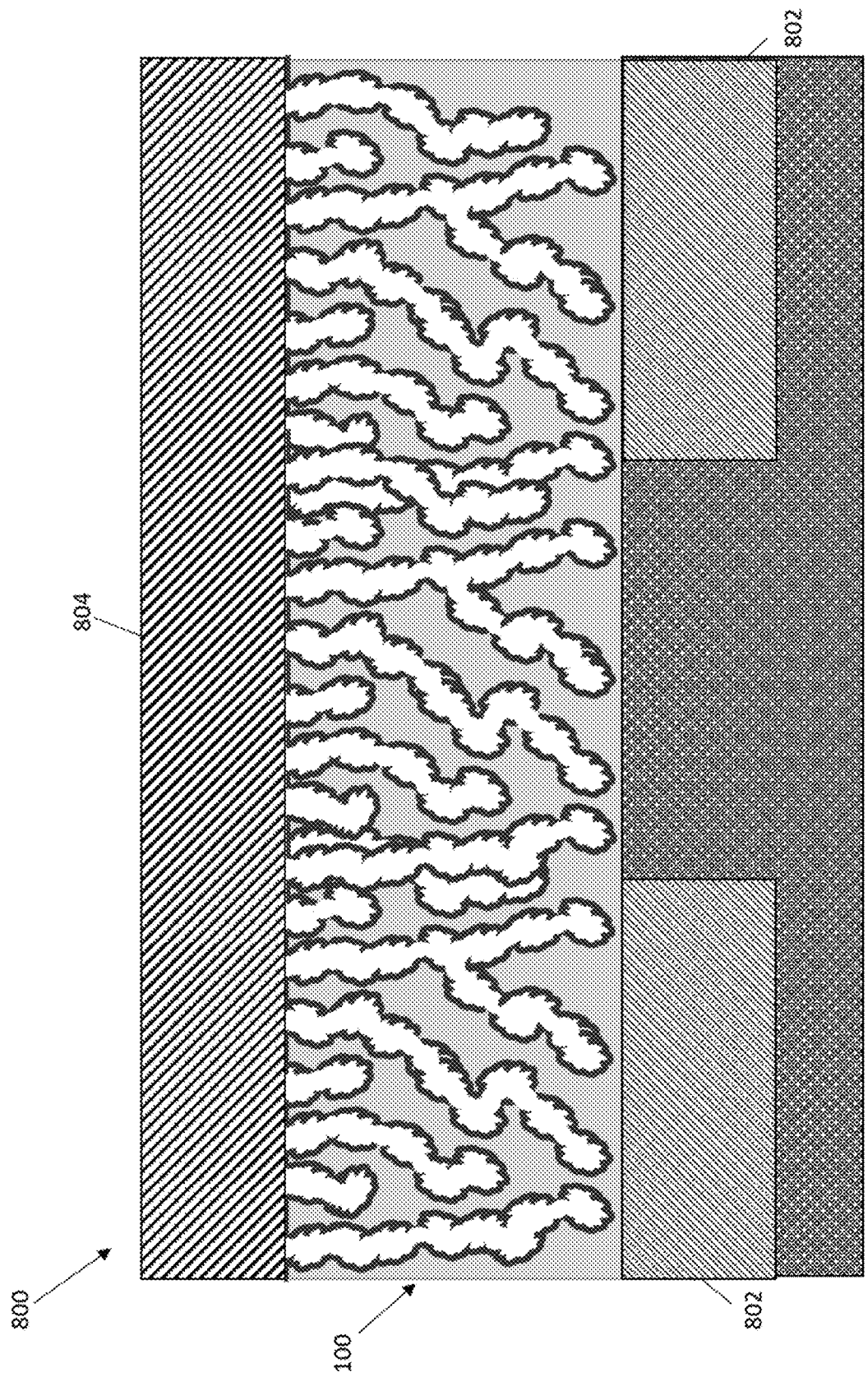
FIG. 8 illustrates an example of a porous thin film utilized in a three terminal device according to a non-limiting embodiment of the present invention.

Turning now to FIG. 7, an example of a porous thin film 100 utilized in a vertical sensor device 700 is illustrated according to a non-limiting embodiment of the present invention. The vertical sensor device 700 includes a pair of electrodes 702 disposed on horizontal portions 105 of the porous thin film 100 and are separated from one another by a vertical portion 107, e.g., a "vertical fin" 107 of the porous thin film 100. The vertical fin 107 increases sensor surface area, thereby providing a sensor device 700 with increased sensitivity. Referring now to FIG. 8, an example of a porous thin film 100 utilized in a three terminal device 800 is illustrated according to a non-limiting embodiment of the present invention. The three terminal device 800 can include, but is not limited to, a transistor or an electrochemical memory cell such as, for example, electrochemical random access memory (ECRAM).

According to a non-limiting embodiment, the three terminal device 800 includes a pair of terminals 802 formed on a first surface of the porous thin film 100, and a terminal 804 formed on a second surface of the porous thin film 100. Although the example in FIG. 8 shows terminals 802 formed on the bottom surface of the porous thin film 100 while terminal 804 is formed on the top surface of the porous thin film 100, it should be appreciated that the arrangement of the terminals can be reversed, i.e., terminals 802 can be formed on the top surface of the porous thin film 100 while terminal 804 is formed on the bottom surface of the porous thin film 100.

Figure 9:
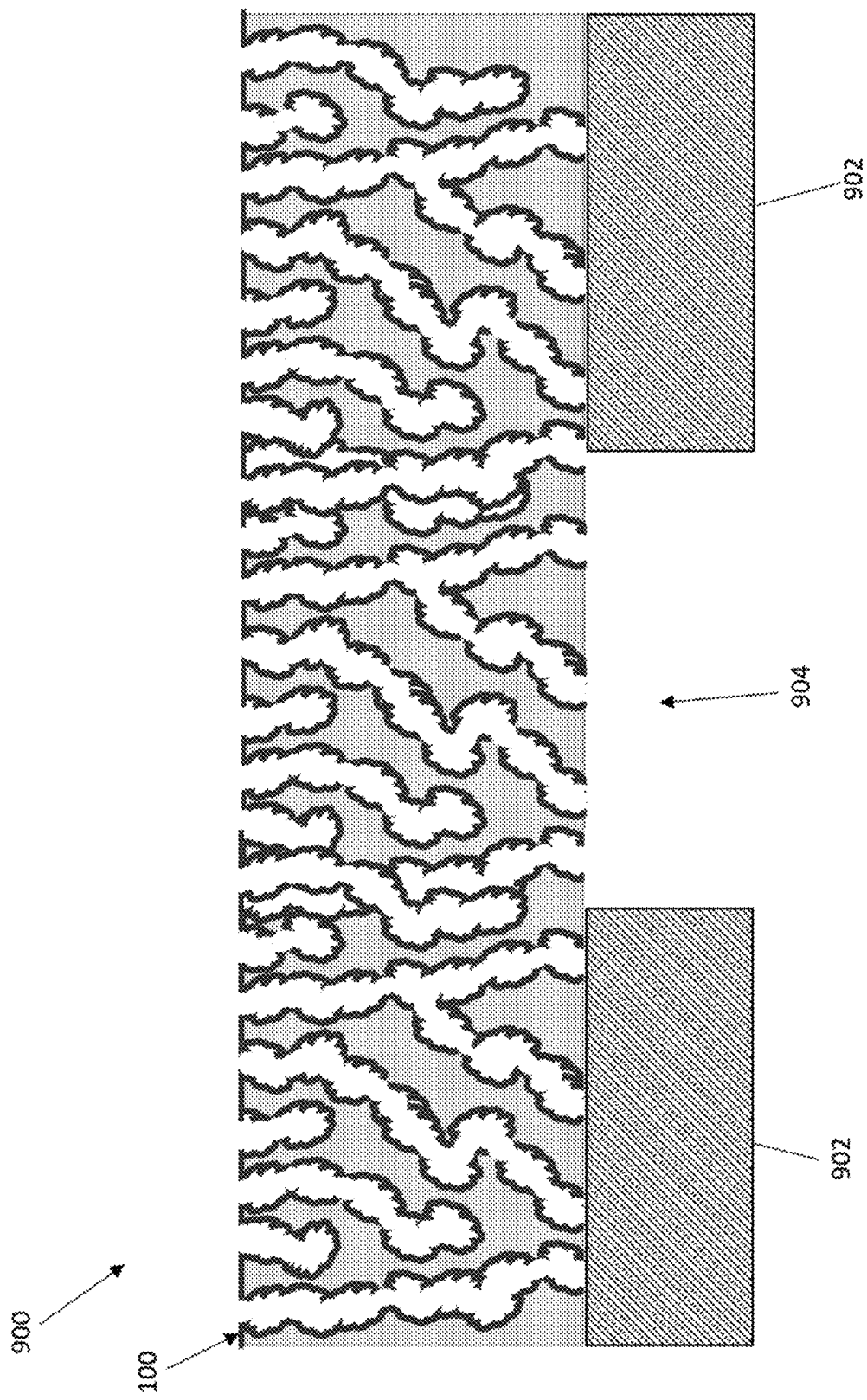
FIG. 9 illustrates an example of a porous thin film utilized in a filter device according to a non-limiting embodiment of the present invention.

With reference now to FIG. 9, an example of a porous thin film 100 utilized in a filter device 900 is illustrated according to a non-limiting embodiment of the present invention. The filter device 900 can include, but is not limited to, a free standing porous film filter configured to filter various chemicals (e.g., reverse osmosis filtering) and DNA (e.g., DNA strand filtering). For example, ZnO, $TiO_2$ and SnO are known to be gas and ultraviolet (UV) sensitive.

According to a non-limiting embodiment, the filter device 900 includes first and second opposing electrodes 902 formed on a surface of the porous thin film 100. Although the example in FIG. 9 shows the electrode 902 disposed on the bottom surface of the porous thin film 100, it should be appreciated that the electrodes 902 can be formed on the top surface of the porous thin film 100 without departing from the scope of the invention. The first and second electrodes 902 are separated from one another by an aperture 904 configured to pass particles, chemicals, gases, DNA strands, etc. therethrough.

As described herein, a method of synthesizing a porous thin film is provided. In some embodiment of the present invention, the method includes semiconductor allowable processes to create a porous metal oxide dielectric via an array of possible oxidation steps, and then coats the pore with a second metal oxide. Accordingly, the method allows for forming multiple interfaces inside a doped metal oxide. The interfaces include, for example, a first metal oxide-to-second metal oxide (MO1:MO2) interface and a metal oxide-to-air (MO2:air) interface. Accordingly, embodiments of the present invention provide a method for forming a vertical metal oxide-to-metal oxide (MO1:MO2) doping profile not found in existing layered doping methods that create laminates, either uniformly or non-uniformly distributed or synthesized. In this manner, a novel material can be produced that can be used as a component in a neuromorphic device such as, for example, a memristor Embodiments of the present invention describes the use of an inorganic/organic film and the processes to make it porous via oxidation, with an additional deposition process to coat the pore walls with a second or more materials. One or more embodiments of the invention provides a novel porous thin film that can be used as a component in a neuromorphic device such as a memristor.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Some examples are included in FIGS. 5 thru 8. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method to synthesize a porous thin film, the method comprising:
    performing an oxidation process to remove carbon impurities from a framework such that pores are formed in the framework, each of the pores extending from an upper surface of the framework to a bottom surface contained in the framework; and
    doping the framework by performing a high aspect ratio (HAR) atomic layer deposition (ALD) process to deposit a pore-coating film that coats sidewalls and a bottom surface of the pores,
    wherein the HAR ALD process uses an oxidizer and is performed at a low temperature ranging from about 50 degrees Celsius (50° C.) to about 250° C. so as to form organic impurities comprising a carbon material, and
    wherein a thickness of the pore-coating film defines an inner thickness of the pores.

2. The method of claim 1, wherein the framework comprises a first metal oxide material.

3. The method of claim 2, wherein the first metal oxide comprises hafnium oxide ($HfO_2$).

4. The method of claim 3, wherein the pore-coating film comprises a second metal oxide material.

5. The method of claim 4, wherein the pore-coating film comprises aluminum oxide ($Al_2O_3$).

6. The method of claim 1, wherein the HAR ALD process includes an infiltration process performed at a temperature that is less than about 350 degrees Celsius.

7. The method of claim 6, wherein the oxidation process performed to remove the carbon impurities includes a remote plasma etch.

8. The method of claim 7, wherein the remote plasma etch is performed at a temperature of about 100° C. for a time period ranging from about 10 seconds to about 600 seconds or more depending on film thickness and diffusion of oxidant into film.

9. A method to synthesize a porous thin film, the method comprising:
   forming a non-organic framework including a plurality of organic impurities, the organic impurities extending from a first end located at an upper surface of the framework to a second end contained in the framework;
   removing the organic impurities to form pores extending from the upper surface of the framework to a bottom surface contained in the framework; and
   coating sidewalls and the bottom surface of the pores with a pore-coating film,
   wherein forming the non-organic framework includes performing an atomic layer deposition (ALD) process to deposit a metal oxide material on a substrate, the ALD process using an oxidizer that is performed at a low temperature ranging from about 50 degrees Celsius (50° C.) to about 250° C. so as to form the organic impurities comprising a carbon material.

10. The method of claim 9, wherein the oxidizer is one of water or an alcohol-based precursor.

11. The method of claim 9, wherein the metal oxide material is selected from the group consisting of hafnium oxide ($HfO_2$), aluminum oxide ($Al_2O_3$) zirconium oxide (ZrO), cerium oxide (CeO2) and titanium oxide ($TiO_2$).

12. The method of claim 9, wherein coating the sidewalls and the bottom surface of the pores with the pore-coating film comprises performing a performing high aspect ratio (HAR) atomic layer deposition (ALD) process at a temperature that is less than about 350 degrees Celsius.

13. The method of claim 12, wherein the pore-coating film comprises a second metal oxide material.

14. The method of claim 9, wherein removing the organic impurities comprises performing a remote plasma etch at a temperature of about 100° C. for a time period ranging from about 10 seconds to about 600 seconds or more depending on film thickness and diffusion of oxidant into film.

* * * * *